United States Patent [19]

Zajac

[11] 4,182,646

[45] Jan. 8, 1980

[54] PROCESS OF ETCHING WITH PLASMA ETCH GAS

[76] Inventor: John Zajac, 1115 E. Arques Ave., Sunnyvale, Calif. 94086

[21] Appl. No.: 928,597

[22] Filed: Jul. 27, 1978

[51] Int. Cl.$^2$ ............................................. C23F 1/00
[52] U.S. Cl. .................................. 156/643; 156/646; 156/656; 156/665; 156/667; 204/192 E; 252/79.1
[58] Field of Search .................... 204/192 E, 192 EC; 156/643, 646, 656, 659, 665, 904, 667, 650–652; 252/79.1

[56] References Cited

U.S. PATENT DOCUMENTS

| | | | |
|---|---|---|---|
| 3,994,793 | 11/1976 | Harvilchuck et al. | 156/646 X |
| 4,030,967 | 6/1977 | Ingrey et al. | 156/643 |

*Primary Examiner*—William A. Powell

[57] ABSTRACT

A method of etching aluminum in a planar plasma etcher is disclosed wherein a first plasma of carbon tetrachloride is developed followed by a second plasma of carbon tetrachloride and chlorine. By generating the specific claimed plasmas at specific partial pressures in two steps, the selectivity of the etching operation is greatly enhanced while disadvantages encountered in etching aluminum with prior art techniques are greatly reduced.

14 Claims, No Drawings

PROCESS OF ETCHING WITH PLASMA ETCH GAS

BACKGROUND OF THE INVENTION

The gas plasma vapor etching process has recently been utilized for performing operations on semiconductor wafers by exposing the plasma to remove portions of material carried by the semiconductor structure. The extension of reactive plasma etching beyond the patterning of silicon, silicon nitride and silicon oxides to include aluminum etching offers several potential advantages in the production of small geometry integrated circuits. Plasma as compared to chemical etching of metal produces better edge definition, less undercutting, considerably less photoresist adhesion sensitivity, and the elimination of so-called "knee breakdown" due to thinning of the photoresist at sharp edges. This thinning where the aluminum goes over and down the side wall of a cut leads to premature resist failure during wet etching, thus permitting removal of the metal at the near edge.

Although plasmas are not clearly understood, it is known that a special form of chemical materials can be made by exposing the compounds to high energy radio frequencies. Under the influence of these radio frequencies, compounds break down and rearrange to form transitory species with life spans so short that they are difficult to identify. Accordingly, unexpected reactions can be effected in a plasma that are difficult or impossible to effect using more conventional techniques.

It has been recognized that the plasma etching of aluminum presents certain inherent problems which are not easily overcome. Such a realization was presented by Poulsen et al in an article entitled PLASMA ETCHING OF ALUMINUM wherein it was stated that aluminum cannot be plasma etched in common chlorine-based etch gases (e.g., $Cl_2$ or HCl) due to the protective masking of aluminum by the thin aluminum oxide ($Al_2O_3$) layer that forms on aluminum surfaces upon exposure to air. Poulsen accomplished his etching by using boron trichloride ($BCl_3$) and carbon tetrachloride ($CCl_4$) plasmas. In this way, it was found that the aluminum oxide could be removed to allow etching of the exposed aluminum via a reaction with chlorine radicals in the plasma. Poulsen used a single etching process to remove both the protective aluminum oxide and underlying aluminum with one etch gas.

In a second article entitled PLASMA ETCHING OF ALUMINUM by Herndon et al at the M.I.T. Lincoln Laboratory, it was taught that a two-step process could be employed by starting with boron trichloride or carbon tetrachloride followed by a second chemical etch of chlorine. The first plasma etching process removed the aluminum oxide coating while the second chemical etch acted to pattern the underlying aluminum layer.

By practicing the methods of Pousen et al., Herndon et al. and others who have attempted to carry out a plasma etching process of aluminum, certain serious difficulties were encountered. For example, boron trichloride, either taken alone or in an argon, nitrogen or helium carrier gas is extremely corrosive. The plasma etching chamber and electrodes deteriorate extremely rapidly when boron trichloride is used to remove the aluminum oxide coating from the aluminum layer to be etched. Carbon tetrachloride is not as corrosive as boron trichloride but has extremely poor selectivity over silicon dioxide ($SiO_2$) and photoresist. Aluminum is placed upon a silicon dioxide substrate in order to produce a semiconductor device. The aluminum is then protected by the image-wise application of a photoresist layer. An ideal plasma etching process would remove only the aluminum, and not the photoresist, while leaving the silicon dioxide untouched. As stated, carbon tetrachloride as a sole etchant gas does a very poor job in accomplishing these goals.

The use of chlorine to etch aluminum is known and is shown in both articles referred to above. Practitioners have used chlorine with boron trichloride, but its use with carbon tetrachloride is not universal for it was found that chlorine inhibits the etching of aluminum oxide in a carbon tetrachloride system. Herndon et al. implies that experiments employing chlorine as a second etchant gas have been carried out, but applicant has found that the unrestricted use of chlorine as a second stage in the etching process causes isantropic etching. This means that chlorine does not produce acceptable edge definition for chlorine acts to undercut the photoresist and acts to etch aluminum below the photoresist in "protected" areas. Furthermore, the use of the combination of carbon tetrachloride and chlorine as etchant gases in the plasma etching of aluminum acts to form a polymer film, which is not capable of being removed from the substrate surface.

SUMMARY OF THE INVENTION

It is an object of the present invention to plasma etch aluminum surfaces in the fabrication of semiconductor devices without the disadvantages outlined above.

It is a further object of the present invention to carry out plasma etching of aluminum without the use of boron trichloride or other highly corrosive plasma species.

It is yet another object of the present invention to carry out the plasma etching of aluminum while minimizing isantropic etching.

It is still another object of the present invention to employ a carbon tetrachloride/chlorine etchant gas system without the formation of polymer films which are not capable of being removed from the substrate surface.

It is still another object of the present invention to carry out the plasma etching of aluminum while maintaining the characteristic sharp vertical edge etching characteristics of carbon tetrachloride while using a carbon tetrachloride/chlorine plasma etchant system.

It is still another object of the present invention to carry out the plasma etching of aluminum while decreasing photoresist degradation as much as 60 percent.

It is a further object of the present invention to plasma etch aluminum under reduced power requirements while producing an improved etching operation.

Plasma etching is carried out in an apparatus similar to that disclosed in co-pending application Ser. No. 928,594 entitled "PLASMA ETCHING APPARATUS", filed July 27, 1978. Similar apparatus is also shown in U.S. Pat. No. 3,757,733 entitled "RADIAL FLOW REACTOR", issued on Sept. 11, 1973, the disclosure of which is herein incorporated by reference. Generally, the apparatus comprises a holder for aluminum wafers which are to be etched. The holder sits on the surface of the lower electrode of a planar capacitor structure that forms part of the vacuum chamber. The etch gas is bled into the vacuum chamber at a flow rate controlled by a valve and the pressure set by throttling a mechanical vacuum pump. Pressure and flow rate are accurately monitored with a capacitance manometer and a mass flow meter. The upper and lower electrodes are carefully aligned relative to one another to achieve radially symmetric gas flow and electric fields in the plasma region for best etch rate uniformity. The RF power is coupled into the electrodes. Current is monitored for accurate power settings. The electrode spacing is adjustable and the temperature of the lower electrode is adjustably controlled.

In a typical etching application, the system is opened, the wafers are loaded on platens around the lower electrode, the system is evacuated, the etch gas is introduced, and etching begins when the plasma is struck between the 28" diameter electrodes.

The objects of the present invention are accomplished by employing a first plasma of substantially pure carbon tetrachloride at a partial pressure of approximately 300 microns to remove the aluminum oxide coating from the pure aluminum layer. The power employed is approximately 3.5 amps and the wafer platform temperature is set at 70° C. The protective layer of aluminum oxide was removed in approximately three minutes.

The second stage involves employing a combination of carbon tetrachloride and chlorine wherein the partial pressure of the chlorine is approximately 50 to 100 microns, while the partial pressure of carbon tetrachloride is approximately 80 to 150 microns. The total pressure of the system was maintained at approximately 250 microns.

It was found that employing the etchant gases at the partial pressures recited above, a 1000 angstroms/min. etch rate could be achieved by employing only 2 amps of current, while prior art techniques employing pure carbon tetrachloride as the plasma etchant gas required 3 amps to maintain a 1000 angstroms/min. etch rate.

Although the specific etch rates, power requirements and other parameters of the system are variable according to the specific design of the plasma etching apparatus which is employed, there are certain specific characteristics which must be maintained and which form the heart of the present invention. More specifically, it was found that if the partial pressure of the chlorine exceeded 100 microns, difficult to remove polymers built-up upon the aluminum layer. It was also found that if the total pressure during the second etchant stage employing chlorine and carbon tetrachloride exceeded approximately 250 microns, that a polymer film would also develop. It was also found that if the partial pressure of chlorine was allowed to exceed that of carbon tetrachloride, that isantropic etching occurred. Lastly, it was found that if the partial pressure of chlorine was less than one-half the partial pressure of carbon tetrachloride, the effectiveness of the chlorine gas as an etchant for aluminum was negligent. Thus, the present invention comprises a two-step plasma etchant process wherein a first etchant operation removes the aluminum oxide from the aluminum surface. The preferred first step employed a pure carbon tetrachloride plasma at or below approximately 300 microns. A second etchant operation was carried out by using carbon tetrachloride and chlorine in combination wherein the total pressure of the system did not exceed 250 microns, and preferably between 150 to 250 microns, the partial pressure of chlorine was kept below 100 microns, the partial pressure of chlorine was not allowed to exceed that of carbon tetrachloride and, lastly, the partial pressure of chlorine was greater than one-half the partial pressure of carbon tetrachloride. If was further found that the most optimum etchant characteristics were achieved when, during the second cycle, the partial pressure of chlorine was kept between 50 to 100 microns while the partial pressure of carbon tetrachloride was kept between 80 to 150 microns.

By employing the process of the present invention, it was possible to maintain an etching selectivity of at least approximately 25 to 1. That is, bare aluminum would etch 25 times faster than silicon dioxide.

It is to be understood that the foregoing description of specific partial pressures of the various species is made by way of example and is not to be considered as a limitation on the scope of the present invention.

What is claimed is:

1. A process for etching an aluminum article having thereon, a coating of aluminum oxide comprising:
   A. developing a plasma of carbon tetrachloride;
   B. exposing selected areas of the aluminum article to the carbon tetrachloride plasma until substantially all aluminum oxide has been removed in said selected areas; and
   C. etching said aluminum article in areas where said aluminum oxide has been removed with a plasma comprised of carbon tetrachloride and chlorine wherein:
      (1) the total pressure of the carbon tetrachloride and chlorine plasmas is at or below approximately 250 microns;
      (2) the partial pressure of chlorine plasma is at or below approximately 100 microns; and
      (3) the partial pressure of chlorine plasma is below the partial pressure of carbon tetrachloride plasma.

2. The process of claim 1 wherein the partial pressure of the chlorine plasma is in excess of one-half the partial pressure of the carbon tetrachloride plasma.

3. The process of claim 1 wherein the partial pressure of the chlorine plasma is approximately 50 to 100 microns.

4. The process of claim 1 wherein the partial pressure of carbon tetrachloride is approximately between 80 to 150 microns.

5. The process of claim 1 wherein the etch rate of the aluminum article is approximately 1000 angstroms/min.

6. The process of claim 1 wherein the total pressure of the carbon tetrachloride-chlorine plasmas is approximately between 150 to 250 microns.

7. The process of claim 1 wherein the etching selectivity is at least approximately 25 to 1.

8. A process for etching an aluminum article having thereon, a coating of aluminum oxide comprising:
   A. developing a first plasma;
   B. exposing selected areas of the aluminum article to said first plasma until substantially all aluminum oxide has been removed in said selected areas; and
   C. etching said aluminum article in areas where said aluminum oxide has been removed with a plasma comprised of carbon tetrachloride and chlorine wherein:
      (1) the total pressure of the carbon tetrachloride and chlorine plasmas is at or below approximately 250 microns;
      (2) the partial pressure of chlorine plasma is at or below approximately 100 microns; and (3) the partial pressure of chlorine plasma is below the partial pressure of carbon tetrachloride plasma.

9. The process of claim 8 wherein the partial pressure of the chlorine plasma is in excess of one-half the partial pressure of the carbon tetrachloride plasma.

10. The process of claim 8 wherein the partial pressure of the chlorine plasma is approximately 50 to 100 microns.

11. The process of claim 8 wherein the partial pressure of carbon tetrachloride is approximately between 80 to 150 microns.

12. The process of claim 8 wherein the etch rate of the aluminum article is approximately 1000 angstroms/min.

13. The process of claim 8 wherein the total pressure of the carbon tetrachloride-chlorine plasmas is approximately between 150 to 250 microns.

14. The process of claim 8 wherein the etching selectivity is at least approximately 25 to 1.

* * * * *